(12) United States Patent
Yamazaki

(10) Patent No.: US 7,401,316 B2
(45) Date of Patent: Jul. 15, 2008

(54) METHODS AND APPARATUS FOR SYNTHESIZABLE PIPELINE CONTROL

(75) Inventor: Takeshi Yamazaki, Tokyo (JP)

(73) Assignee: Sony Computer Entertainment Inc. (JP)

( * ) Notice: Subject to any disclaimer, the term of this patent is extended or adjusted under 35 U.S.C. 154(b) by 476 days.

(21) Appl. No.: 11/110,552

(22) Filed: Apr. 20, 2005

(65) Prior Publication Data
US 2005/0251762 A1 Nov. 10, 2005

Related U.S. Application Data

(60) Provisional application No. 60/564,844, filed on Apr. 23, 2004.

(51) Int. Cl.
G06F 17/50 (2006.01)
H03K 19/00 (2006.01)

(52) U.S. Cl. .............................. 716/17; 716/1

(58) Field of Classification Search ................ 716/1, 716/17
See application file for complete search history.

(56) References Cited

U.S. PATENT DOCUMENTS

| | | | |
|---|---|---|---|
| 5,659,706 A | 8/1997 | Beard et al. | |
| 6,370,677 B1 | 4/2002 | Carruthers et al. | |
| 6,826,662 B2 | 11/2004 | Suzuoki et al. | |
| 2002/0108006 A1 | 8/2002 | Snyder | |
| 2003/0009648 A1 | 1/2003 | Doing et al. | |
| 2003/0101307 A1 | 5/2003 | Gemelli et al. | |
| 2005/0021871 A1* | 1/2005 | Georgiou et al. | ............ 709/250 |

OTHER PUBLICATIONS

Rusu et al. "A 1.5-GHz 130-nm Itanium® 2 Processor With 6-MB On-die L3 Cache", IEEE Journal of Solid-State Circuits, vol. 38, No. 11, pp. 1887-1895, Nov. 2003.

* cited by examiner

Primary Examiner—Jack Chiang
Assistant Examiner—Suresh Memula
(74) Attorney, Agent, or Firm—Lerner, David, Littenberg, Krumholz & Mentlik, LLP

(57) ABSTRACT

An organization and method of designing a processor of an integrated circuit are provided which includes identifying reusable portions of a custom design to be created for a processor. The processor is custom designed to meet specific performance criteria. Such custom designing includes custom designing macros for the reusable portions, specifying the number of instances of each macro, providing interconnections for the macros, and assembling the custom-designed macros.

14 Claims, 5 Drawing Sheets

METHODS AND APPARATUS FOR SYNTHESIZABLE PIPELINE CONTROL

CROSS-REFERENCE TO RELATED APPLICATIONS

This application claims the benefit of the filing date of U.S. Provisional Patent Application No. 60/564,844 filed Apr. 23, 2004, the disclosure of which is hereby incorporated herein by reference.

BACKGROUND OF THE INVENTION

The present invention relates to integrated circuits and their design.

In recent years, the design of integrated circuit processors has shifted from stand-alone proprietary designs to designs which support greater networking capability and interoperability with competing designs and legacy platforms. This coincides with a realignment of the computing world with network server computers, replacing the traditionally dominant stand-alone PCs.

Accordingly, it is no longer enough to provide a processor having the highest stand-alone performance. The processor must be adept at handling the computing job at hand, which means efficiently responding to processing calls. A processor design that supports calls arriving from a variety of differently designed processors made by different vendors would be superior, as it would offer a greater degree of interoperability. However, among such designs, higher performance would be achieved when the processors in a network, be they large or small, server or client, share common design features, as described in co-pending, commonly owned U.S. patent application Ser. No. 09/815,554, filed Mar. 22, 2001, which is hereby incorporated by reference herein. Such common designs would desirably utilize a common architecture having a common instruction set or subportions thereof, and a common design for data paths and addressing. Such designs would also desirably support high execution rates for jobs that serve and/or process graphics data. Such designs would support interoperability while promoting the high performance benefits of a shared design.

In designing processors for such purpose, an efficient processor organization and design method are needed. A relatively short design cycle should be realized, regardless of the size of the processor, and the size of the computing job that the processor is designed to support. On the other hand, each processor should provide high performance, at a level rivaling that of traditional stand-alone processors. These different goals seem to conflict, according to traditional design methodologies, as will now be described.

Two existing methodologies are provided by the prior art for designing processors: synthetic design, and custom design. These design methodologies find particular application to the design of processor "cores", i.e., elements of integrated circuits (ICs or "chips") that provide processor function among other functions provided by such chips. An integrated circuit classified as a system-on-a-chip ("SOC") has a processor core.

In the synthetic design approach, as illustrated in FIG. 1, a library of reusable component blocks is developed a priori, as shown at S10, the library being available for designing many varieties of circuits for use with a range of clock speeds and purposes. The reusable component blocks are defined by relatively high-level language, for example, a register transport level ("RTL") description. The designer then assembles the processor design by specifying the component blocks for use therein, as shown at S12. A compiler synthesizes a circuit layout from the component blocks specified in the RTL description. Synthetic design provides flexibility to modify essential features of the processor during the design cycle such as the instruction set, the width of pipelines, and the size of the cache. Such modifications are made by specifying a different set of reusable component blocks in the RTL description, as shown at S14. Synthetic design also allows designs to be created and ready for testing (at a pre-hardware stage) within a relatively short design cycle.

Custom design, on the other hand, is painstaking, requiring a relatively long design cycle. As illustrated in FIG. 2, in a full custom design of a processor, the elements of the processor are designed from the bottom level up, including all functional blocks, as shown at S20. Circuits are handcrafted to specific performance criteria, e.g., to support a minimum clock frequency, to consume less than a certain limit of power, or to occupy less than a certain limit of integrated circuit area. The layout and wiring between functional blocks are also carefully designed to meet the performance criteria, as shown at S22. Because of the greater attention given to each element of the design and the specific emphasis on meeting performance criteria, up to four times greater performance can be achieved when custom designing a processor versus creating the design synthetically. On the other hand, modifications to the custom design pose difficulties, because they require re-designing the processor again from the bottom level up, as shown at S24.

SUMMARY OF THE INVENTION

According to an aspect of the invention, a method of designing a processor of an integrated circuit is provided which includes identifying reusable portions of a custom design to be created for a processor. The processor is custom designed to meet specific performance criteria. Such custom designing includes custom designing macros for the reusable portions, specifying the number of instances of each macro, providing interconnections for the macros, and assembling the custom-designed macros.

According to another aspect of the invention, a processor of an integrated circuit is provided which includes a plurality of elements, at least some of which have a custom design. At least some of the elements having a custom design are reusable, such that an organization of the processor is determined in accordance with a number of instances of each of the reusable elements, and interconnections of the reusable elements.

DETAILED DESCRIPTION

The embodiments of the invention will now be described with reference to FIGS. 3 through 9.

Figure 3:
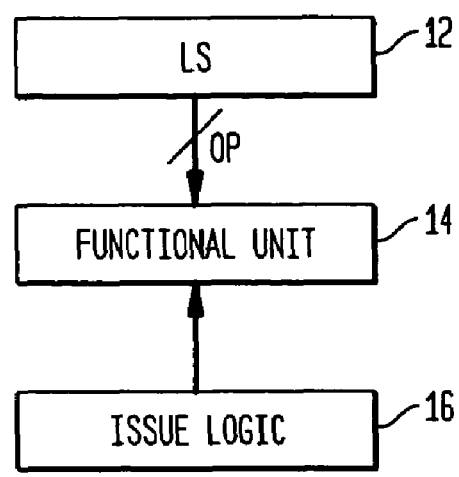
FIG. 3 is a block diagram illustrating organization of a processor according to an embodiment of the invention.

FIG. 3 is a block diagram illustrating the organization of a processor 10, as designed by a method according to an embodiment of the invention. As shown in FIG. 3, the processor includes three basic elements, a local store (LS) 12, a functional unit 14, and issue logic 16. The local store 12 serves to buffer at least data and preferably instructions as well, for execution by the functional unit 14. The functional unit 14 executes instructions upon operands having a width of OP bits. The number of bits OP that can be handled by the functional unit 14 varies by the design of the processor 10. In a particular embodiment, the number of bits OP are an integral multiple of a power of 2, for example, 4, 8, 16, 32 or 64 bits. The functional unit 14 executes instructions upon operands provided thereto from the local store 12.

The issue logic 16 serves to convert instructions queued for execution into signals which operate the functional unit 14. For example, an instruction to multiply two operands in the functional unit is converted into a sequence of operations each of which shifts one operand to the left a number of places determined by a bit of the second operand. Thereafter, the results of the shifting operations are added together, with carry.

Figure 4:
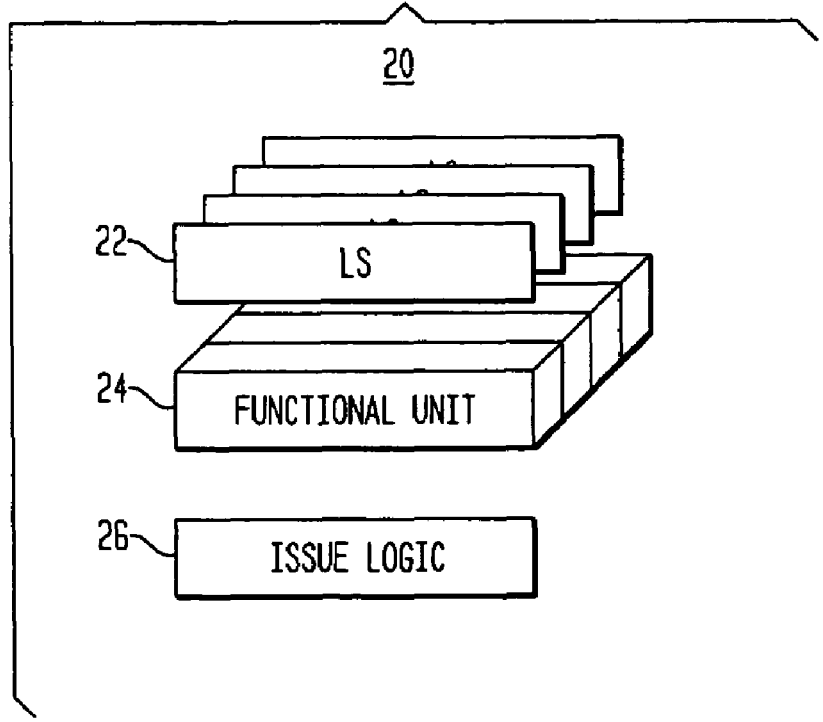
FIG. 4 is a block diagram illustrating organization of a processor according to another embodiment of the invention.

FIG. 4 illustrates the organization of another processor 20, as designed by a method according to an embodiment of the invention. Like the processor 10 shown in FIG. 3, the processor 20 includes issue logic 26 for converting instructions into signals to control their execution by a functional unit. However, unlike the processor 10, processor 20 includes a plurality of local stores (LS) 22 and a plurality of functional units 24. Each local store 22 supplies at least operands to a corresponding functional unit 26, and preferably also supplies instructions to be executed in the functional unit 24 upon the operands. Although preferably implemented in a single integrated circuit, the local stores 22 and functional units 24 of processor 20 are design elements or components which are reused from the design of processor 10. Thus, for example, the processor 10 may include functional units which execute instructions upon 16 bit wide operands, as well as a local store which provides access to 16 bit wide operands, and issue logic handling 64 bit wide instructions. In such case, processor 20 may include four such functional units 24, and four such local stores, as shown, each handling 16 bit wide operands, and issue logic handling 64 bit wide instructions. In such case, instructions can be queued for execution as to four different streams of operands, such as can be provided by cycle-by-cycle multiple threaded execution (as will be described more fully below). Alternatively, the width of the data path through processor 20 is potentially increased by a factor of four when operands are queued in the respective local stores 22 and operated upon by the same instruction.

Figure 5:
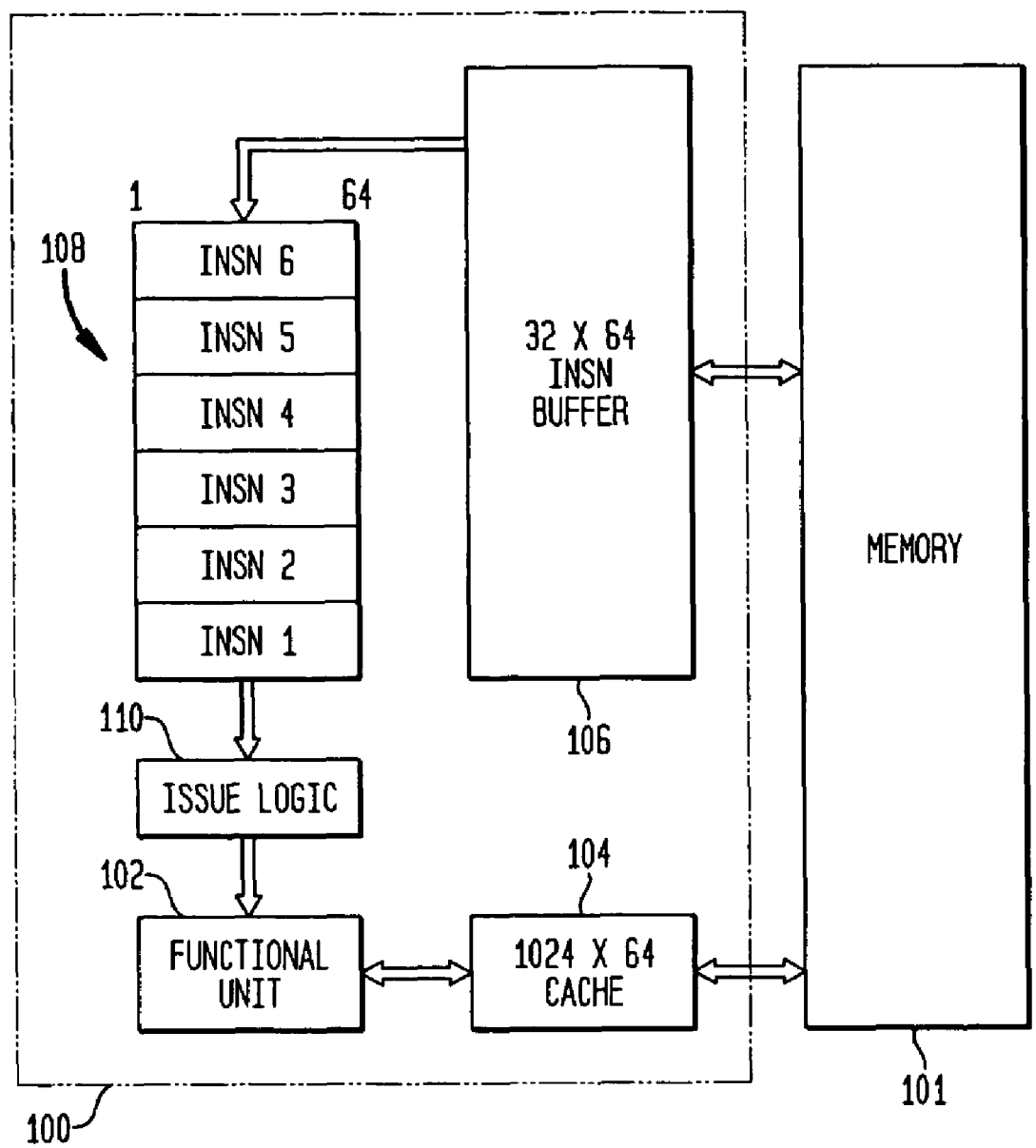
FIG. 5 is a detailed block diagram illustrating organization of a processor according to yet another embodiment of the invention.

FIG. 5 is a more detailed block diagram illustrating the organization of a processor 100 as designed according to an embodiment of the invention. As shown in FIG. 5, the processor 100 includes a functional unit 102, and a cache 104 coupled thereto, the cache 104 serving as a repository for data which are the operands and results of operations executed by the functional unit 102. The processor 100 further includes an instruction buffer 106, from which instructions are delivered into a pipeline 108, for conversion by issue logic 110 into signals for operating the functional unit 102. As further shown in FIG. 5, the processor 100 interfaces to a memory 101 through the cache 104 and the instruction buffer 106. The memory 101 stores data and instructions for execution by processor 100. The processor 100 also stores the results of executing instructions. In addition, if the instructions contain any statements that require interpretation prior to execution, the memory 101 may be used to store further instructions generated as a result of interpreting such statements by the processor 100.

In the example illustrated in FIG. 5, the data path of the cache 104 to and from the processor has width of one double-word (64 bits). The instruction pipeline 108 accommodates instructions that have a width of a double word (64 bits in width). In an embodiment, the cache accommodates up to 1024 of such double words.

The instruction buffer 106 holds instructions fetched from memory 101 for placement in the queue of the instruction pipeline 108. In an embodiment of the invention, the instruction buffer 106 holds a modest number, for example, 32 instructions, each instruction having a width of one double word. Instruction buffers having a smaller or greater capacity can be provided, as needed for the particular application that the processor 100 supports. Preferably, the instruction buffer 106 provides first-in-first-out (FIFO) operation for queuing instructions fetched from memory 101 for output to instruction pipeline 108, but which provides random access as well, to permit instructions to be executed out of the buffered order, as for branching operations.

The instruction pipeline 108 queues a number of instructions for execution from the instructions available in the instruction buffer, such number being six in the example shown in FIG. 5. The instruction pipeline 108 supports a traditional single-threaded approach, in which each instruction (INSN 1, INSN 2, INSN 3, etc.) in the pipelined is from a single stream of instructions and follows, in order, the last previous instruction in the stream of instructions.

The depth of the instruction pipeline 108 is determined primarily by the requirements of the particular processor organization. An instruction pipeline 108 which queues six instructions, as shown here, needs six instruction cycles to process each instruction for conversion into signals that operate the functional unit 102. One or more of these cycles are generally used to check for dependency of an instruction upon the results of an earlier executed instruction. If an instruction is discovered to have such dependency, the results of the earlier executed instruction must be readied for retrieval from cache, or if not available in the cache 104, then from the memory 101.

Occasionally, the results of executing an earlier instruction in the stream are not available in either the cache or the memory 101 at the time of the dependency check, but rather, such results are disposed somewhere "in between" the cache 104 and the memory 101. Stated another way, the data are in process of being transferred from the cache or the memory to the other, and neither storage location permits access to the data at that particular point in time. At such time, few options exist for proceeding. According to one option, the functional unit 102 stalls by performing a series of wait cycles until the data becomes available in the cache and provided to the functional unit 102 for execution of the instruction. This is undesirable, because many processor cycles can be wasted waiting for the data to be ready. Another option is for the current instruction stream to be suspended, and the processor 100 immediately begin loading another instruction stream into the buffer 106 and into the instruction pipeline 108 for execution. However, this option is also undesirable, because many cycles are needed for instructions to be loaded into the buffer 106 and readied for execution in the instruction pipeline 108.

Figure 6:
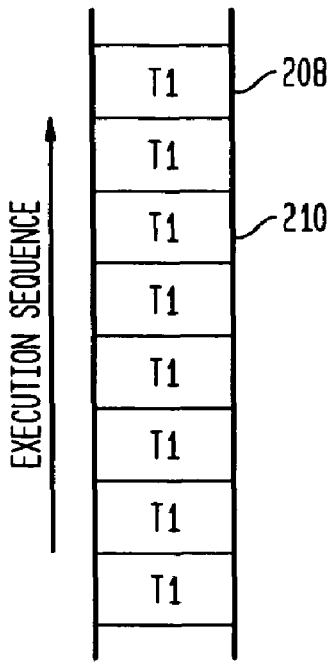
FIG. 6 is a diagram illustrating structure and function of a single-threaded instruction pipeline element of a processor according to an embodiment of the invention.

FIG. 6 illustrates a sequence of execution of instructions held in an instruction pipeline 208. As illustrated in FIG. 6, each instruction in the pipeline 208 is identified by a thread number T1. The thread number T1 identifies a particular sequence of related instructions that have been retrieved from memory. As commonly understood by those having skill in the art, each instruction of a thread often relates to the same work item as the last prior instruction, such that the work item is performed by executing the instructions of a particular thread in sequence. FIG. 6 illustrates the case in which all instructions in a pipeline 208 at a particular point in time are sequentially ordered instructions of a single thread T1. In such arrangement, from time to time, execution of a particular thread may cease, and execution of another thread will begin in its place. Other than such occasional changes between threads, the model shown in FIG. 6 represents an order in which instructions of threads are executed by a processor having a single-threaded instruction pipeline 208. Stated another way, execution of the instructions of a thread T1 is performed sequentially in order.

However, as noted above, such execution can be undesirable for various reasons. If an instruction, e.g. instruction 210, has dependency upon a result of a prior operation, that result must be available to the functional unit 102 (FIG. 5) at the time that instruction 210 is ready for execution, or else, instruction 210 cannot be executed. Consequently, when such dependency occurs, a common response can be to remove the current stream of instructions of the thread T1 from the instruction pipeline 208 and begin filling the pipeline 208 with the instructions of another thread T11 (not shown). As the instruction pipeline 208 has a depth of eight, the latency for reloading the pipeline is eight. Accordingly, at least eight cycles are wasted in reloading the instruction pipeline during such changeover between threads.

Figure 7:
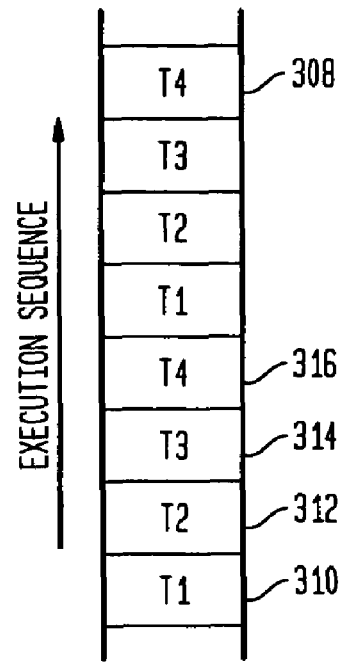
FIG. 7 is a diagram illustrating structure and function of a cycle-by-cycle multithreaded instruction pipeline element of a processor according to an embodiment of the invention.

FIG. 7 illustrates an instruction pipeline 308 which greatly reduces the impact of the above-noted problem. As shown in FIG. 7, instructions awaiting execution in the pipeline 308 belong to different threads. While the instructions of each thread are ordered sequentially within each thread, instructions of each thread are queued such that on each successive instruction cycle, an instruction belonging to a different thread is executed. Thus, during a first cycle, an instruction 310 belonging to a thread T1 is executed. There follows, during a second cycle, the execution of an instruction 312 from a thread T2. During the third cycle, an instruction 314 belonging to a thread T3 is executed, followed by the execution of an instruction 316 belonging to a thread T4 in the fourth cycle. Such pipelining of instructions of different threads for execution as described here is known as "cycle-by-cycle multiple threading (or 'multithreading')."

Cycle-by-cycle multithreading benefits the efficiency of the processor, as it makes the execution of instructions more immune from dependencies. Because there are four threads of instructions awaiting execution in the instruction pipeline 308, an unsatisfied dependency (e.g. cache miss) as to an instruction 314 of a particular thread T3 does not cause the execution of other threads T1, T2 and T4 to be suspended. Nor does a wait state as to a particular thread T3 disrupt execution of the other threads. Execution of instructions of threads T1, T2 and T4 proceeds as before.

Moreover, cycle-by-cycle multithreading reduces the latency for executing instructions of each thread. As shown in FIG. 7, in an instruction pipeline having a depth of eight instructions and in which multi-threading is provided as to four threads, the latency as to each thread is only two because no more than two instructions of each thread await execution in the instruction pipeline 308 at any one point in time. Moreover, when a new thread is loaded into the instruction pipeline 308 in place of a thread having an unsatisfied dependency, at most only two cycles are wasted instead of eight.

Note that an instruction pipeline can be of any arbitrary length and any arbitrary number of threads can be interleaved in an instruction pipeline which supports cycle-by-cycle multithreading, as described above.

For the foregoing reasons, a processor design methodology is highly desirable which performs at a level rivaling that of a full custom design, but with the flexibility to vary the number and interconnection of certain reusable elements, and which has the capability, if desired, to be operated in a cycle-by-cycle multithreading manner.

Figure 8:
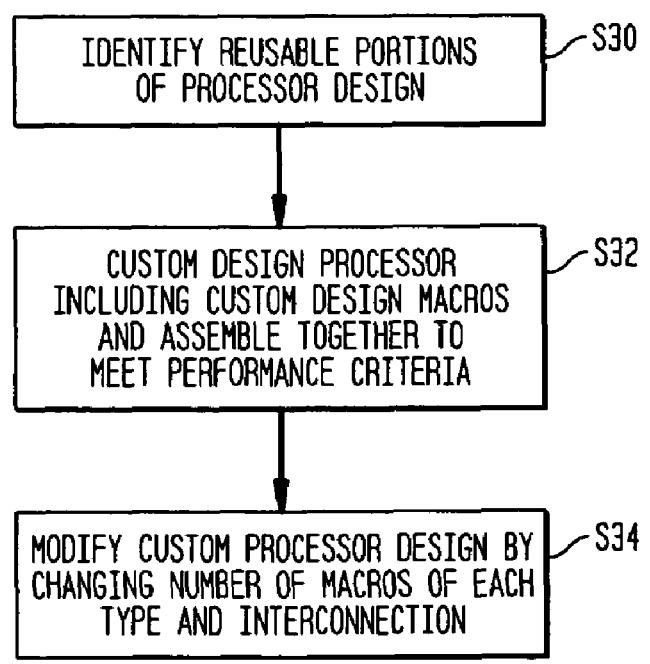
FIG. 8 is a flow diagram illustrating a design method according to an embodiment of the invention.
Figure 9:
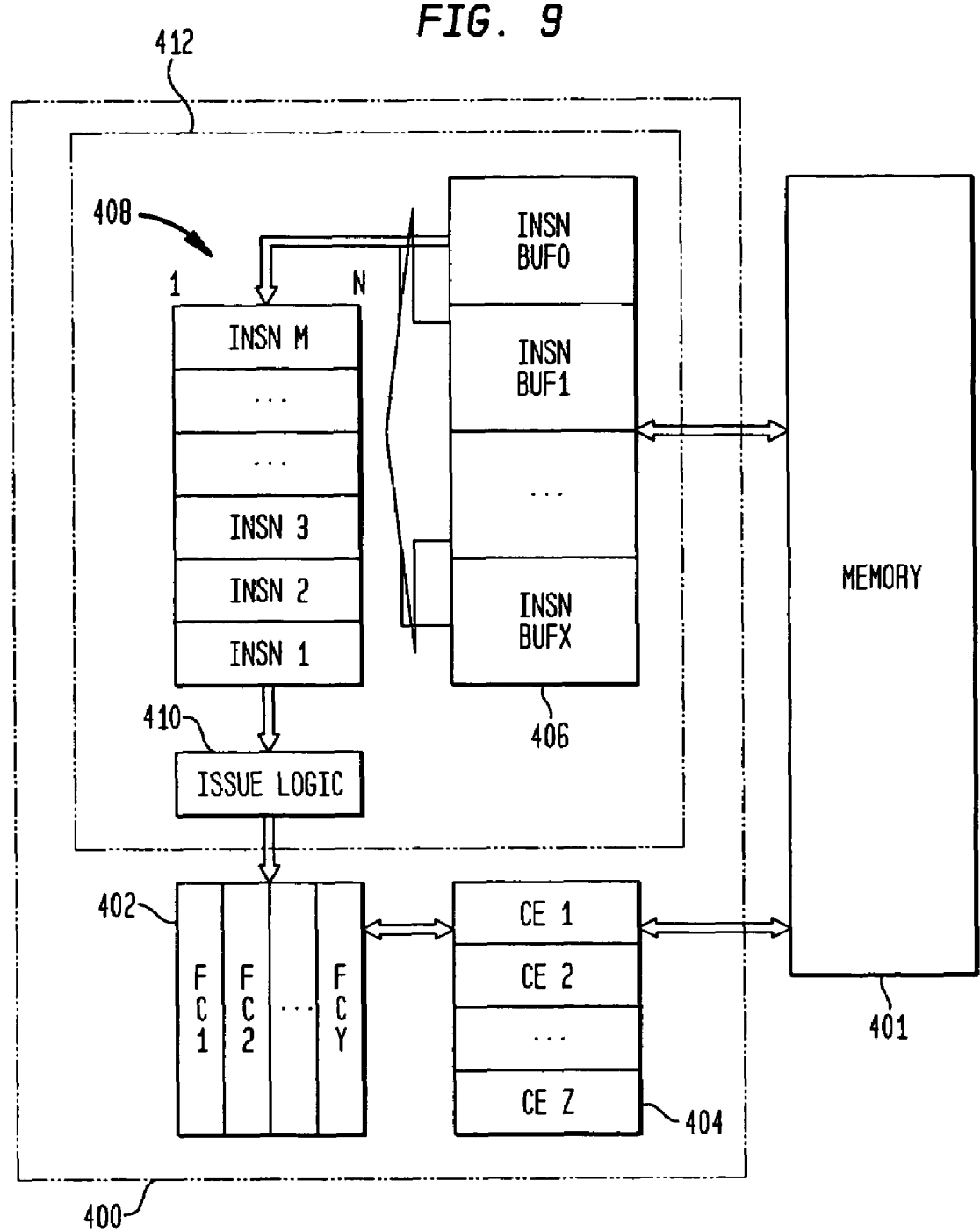
FIG. 9 is a detailed block diagram illustrating organization of a processor assembled according to a design method embodiment of the invention.

FIG. 8 is a flowchart illustrating a method of designing a processor according to an embodiment of the invention. FIG. 9 is a block diagram illustrating the organization of a processor designed in accordance with such method. As shown in FIG. 8, a first step in such method is to identify reusable portions of the processor design, as shown at S30. A processor includes elements that repeat, although such elements vary in their particular interconnection to other elements.

Referring to FIG. 9, the organization of a processor 400 designed by the method disclosed herein varies according to the numbers of reusable elements identified in step S30, that supports its various functions. Thus, the design of a processor 400 includes a cache 404 having a plurality of reusable cache elements CE 1, CE 2, . . . CE Z. The size of the cache is determined by the number of cache elements that are utilized in the design. Each cache element represents a relatively large fractional portion of the total cache, such that the cache element qualifies as a "macro". For example, a cache having a size of 16K double words can have 16 cache elements, each having a size of 1024 double words.

Figure 1:
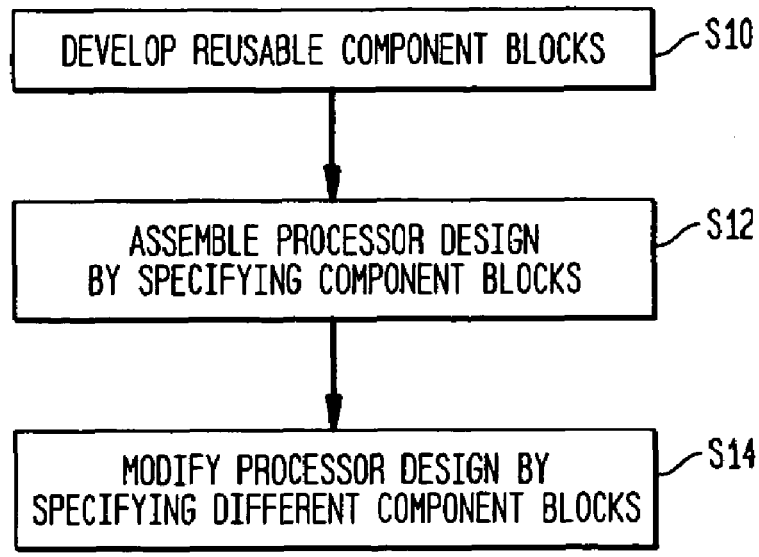
FIG. 1 is a flow diagram illustrating a synthetic design method according to the prior art.
Figure 2:
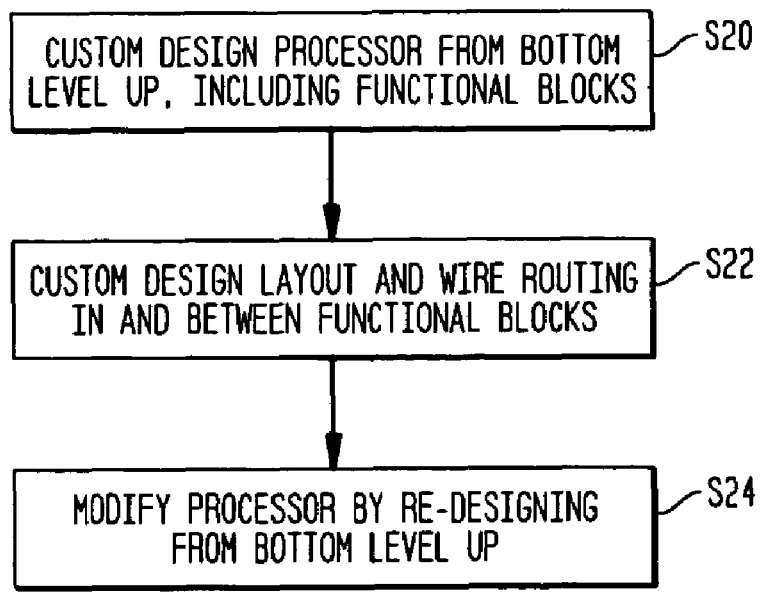
FIG. 2 is a flow diagram illustrating a custom design method according to the prior art.

The next step, S32 (FIG. 8) of the method is to custom design the processor, including the macros which make up the processor. Accordingly, within each such macro, the layout and wiring are painstakingly designed by handcrafting, in order to meet specific performance criteria. Such performance criteria include achieving a target clock frequency, which can be considered exceeding a lower limit for clock frequency. The performance criteria can further include meeting a target requirement for integrated circuit area, which can be considered as meeting an upper limit for integrated circuit area. This step is similar to the custom design methodology described above with reference to FIG. 2, except that the design method now requires reusable elements to be made available as macros to be combined and to function together in the design as a whole.

After completing the design of each macro, and determining how many instances of such custom-designed macros are needed to support the particular function, the processor design is then assembled together from the macros. At such time, wiring is preferably custom-designed for interconnecting instances of macros to each other, to other macros, and to other elements of the design. In such manner, the processor is designed to stringent performance criteria, which may even be as stringent as the performance criteria to which a processor is designed according to the method described above with reference to FIG. 2.

Thereafter, as further illustrated in FIG. 8, step S34 provides for modifying the processor design by changing the number of instances of macros of each type that are used in the design and their interconnection. Such provides the flexibility and versatility of the design method according to an embodiment of the invention.

A processor organization resulting from this method is best understood with reference to FIG. 9. In the illustrated embodiment, in addition to the cache 404 being assembled by specifying the number of instances of cache element macros CE 1, CE 2, . . . CE Z, other essential features of the processor are determined by the number of instances of macros of other types. Thus, in an embodiment, an instruction buffer 406 is designed by selecting the number of instances of an instruction buffer macro to as to provide the buffers INSN BUF0, INSN BUF1, . . . INSN BUFX, each of which buffers a stream of instructions for a particular thread. Stated another way, multiple instruction buffers are provided, each of which outputs instructions, in round-robin manner, onto an instruction bus coupled to an instruction pipeline 408. The combination of the multiple instruction buffers INSN BUF1, INSN BUF2, etc., the instruction pipeline 408, and the issue logic 410, form an instruction pipeline unit 412 of the processor 400. Such organization including multiple instruction buffers and common output to the instruction pipeline 408 enables operation according to cycle-by-cycle multithreading, as described above with reference to FIG. 7. However, here, unlike the method described above relative to FIG. 2, it is not necessary for the number of instruction buffers to be determined a priori before commencing design efforts. As each macro is designed to be reusable, the size and capabilities of functional elements of the processor are determined in accordance with the number and interconnection of macros of each type. In addition, the depth M and width N of the instruction pipeline 408 are preferably determined in accordance with the number of instances of macros that support that function of the instruction pipeline 408.

In addition, the capabilities of the functional unit 402 of the processor 400 are determined in accordance with the number of instances FC1, FC2, . . . FCY of a functional unit macro that are provided. Each instance of the functional unit macro preferably implements the function of a functional unit 14, or 24, as described above with reference to FIGS. 3 and 4. Stated another way, each instance of the functional unit macro has a function of executing a thread. Thus, for a processor organization having a number Y of functional unit macros each handling operands of OP bits each, two benefits can be achieved. First, multi-threading is possible for up to Y instruction streams. Second, operands having a width of up to Y*OP can be handled in one cycle when functional units are operated together as one unit.

Specific variations in the functional organization of processors are described in the commonly owned, U.S. Provisional Application No. 60/564,682, filed Apr. 22, 2004, which application is hereby incorporated herein by reference.

The foregoing description as to design methods and processor organization, highlight a flexible, versatile way of designing processors of different sizes and capabilities, which nevertheless share common design features, and are suited to meeting specific performance criteria.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of designing a processor of an integrated circuit, comprising:
    identifying reusable portions of a custom design to be created for a processor;
    custom designing said processor to meet specific performance criteria, including:
        custom designing macros for said reusable portions including a first macro having an instruction pipeline function and a second macro having an instruction stream buffer function;
        specifying a number of instances of each macro including a number of instances of said first and second macros; and
        assembling said macros and providing interconnections for said macros including said first macro and a plurality of said second macros to form an instruction pipeline unit and a plurality of instruction stream buffers interconnected with said instruction pipeline unit, each of said instruction stream buffers being operable to buffer an instruction stream different from the instruction stream buffered in at least one other said instruction stream buffer, such that said instruction pipeline unit is operable to provide cycle-by-cycle multiple-threading.

2. A method as claimed in claim 1 wherein said macros include a third macro having a cache function, wherein said step of custom designing said processor includes designing a cache of said processor including selecting a number of instances of said third macro.

3. A method as claimed in claim 2 wherein a size of said cache is selected in accordance with said number of instances of said third macro.

4. A method as claimed in claim 1, wherein said macros include a third macro having a thread execution function, wherein said step of custom designing said processor includes designing an instruction execution element of said processor including selecting a number of instances of said third macro.

5. A method as claimed 4, wherein a number of threads capable of simultaneous execution by said instruction execution element is determined in accordance with said selected number of instances of said third macro.

6. A method as claimed in claim 1 wherein said specific performance criteria includes a lower limit for clock frequency.

7. A method as claimed in claim 6 wherein said custom designing of said processor includes hand-crafting a layout of said processor.

8. A method as claimed in claim 6 wherein said custom designing of said processor includes hand-crafting wiring of said processor.

9. A method as claimed in claim 1 wherein said specific performance criteria includes an upper limit for integrated circuit area.

10. A processor of an integrated circuit, comprising:
    a plurality of elements, at least some of which have a custom design,
    at least some of said elements having a custom design being reusable,
    such that an organization of said processor is determined in accordance with a number of instances of each said reusable element, and interconnections of said reusable elements, and wherein said reusable elements include elements having an instruction pipeline function, wherein an organization of an instruction pipeline unit of said processor is determined in accordance with a number of instances of each said element having an instruction pipeline function, said reusable elements including a plurality of instruction stream buffers, each operable to buffer an instruction stream different from the instruction stream buffered in at least one other said instruction stream buffer, said plurality of instruction stream buffers interconnected to said instruction pipeline unit, such that said instruction pipeline unit is operable to provide cycle-by-cycle multiple-threading.

11. A processor as claimed in claim 10 wherein said reusable elements include elements having a cache function, wherein an organization of a cache of said processor is determined in accordance with a number of instances of each said element having a cache function.

12. A processor as claimed in claim 11 wherein a size of said cache is determined in accordance with said number of instances of said element having a cache function.

13. A processor as claimed in claim 10 wherein said reusable elements include elements having a thread execution function, wherein an organization of an instruction execution element of said processor is determined in accordance with a number of instances of each said element having a thread execution function.

14. A processor as claimed in claim 13 wherein a number of threads capable of simultaneous execution by said instruction execution element is determined in accordance with a number of instances of said element having a thread execution function.

* * * * *

UNITED STATES PATENT AND TRADEMARK OFFICE
CERTIFICATE OF CORRECTION

PATENT NO. : 7,401,316 B2  Page 1 of 1
APPLICATION NO. : 11/110552
DATED : July 15, 2008
INVENTOR(S) : Takeshi Yamazaki It is certified that error appears in the above-identified patent and that said Letters Patent is hereby corrected as shown below:

Column 3, line 24, "are" should read --is--.

Column 4, line 65, before "and", insert --is--.

Column 6, line 45, after "method", insert --,--.

Column 7, line 18, "to as to" should read --so as to--.

Column 7, line 60, after "organization", delete ",".

Column 7, line 60, "highlight" should read --highlights--.

Column 8, line 44, after "claimed", insert --in claim--.

Column 8, line 49, "includes" should read --include--.

Column 8, line 58, "includes" should read --include--.

Signed and Sealed this

Twenty-seventh Day of October, 2009

David J. Kappos
*Director of the United States Patent and Trademark Office*